Figure 1:
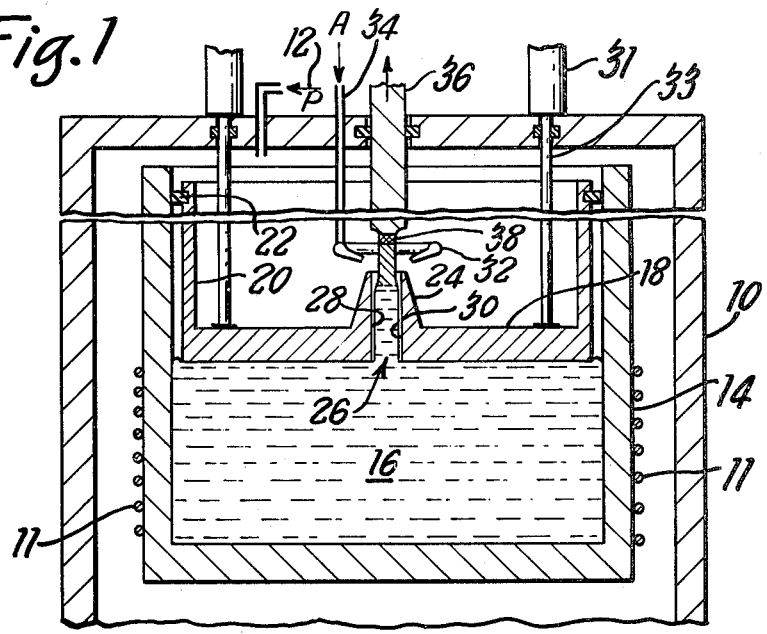

United States Patent [19]
Cole

[11] 4,211,600
[45] Jul. 8, 1980

[54] CRYSTAL GROWTH

[75] Inventor: Michael Cole, Sandy, England

[73] Assignee: Metals Research Limited, Hertfordshire, England

[21] Appl. No.: 637,309

[22] Filed: Dec. 3, 1975

[30] Foreign Application Priority Data

Dec. 4, 1974 [GB] United Kingdom ............... 52379/74

[51] Int. Cl.² .............................................. B01J 17/18
[52] U.S. Cl. ............................ 156/608; 156/DIG. 88
[58] Field of Search ................. 156/607, 608, 617 SP, 156/617 R, DIG. 64, DIG. 67, DIG. 88

[56] References Cited

U.S. PATENT DOCUMENTS

| | | | |
|---|---|---|---|
| 3,002,824 | 10/1961 | Francois | 156/608 |
| 3,078,151 | 2/1963 | Kappelmeyer | 23/273 SP |
| 3,124,489 | 3/1964 | Vogel | 23/273 SP |
| 3,265,469 | 8/1966 | Hall | 156/608 |
| 3,291,650 | 12/1966 | Dohmen | 156/608 |
| 3,401,023 | 9/1968 | Mullin | 156/607 |
| 3,453,352 | 7/1969 | Goundry | 156/608 |
| 3,650,703 | 3/1972 | Labelle | 156/608 |

FOREIGN PATENT DOCUMENTS

41-13241 4/1966 Japan ....................................... 156/608

OTHER PUBLICATIONS

Nygren et al., J. Electrochem. Soc., Solid State Science, Feb. 1971, pp. 306 to 312.
Tsivinskii and Stepanov, Soviet Physics–Solid State, vol. 7, #1, Jul. 1965, pp. 148–152.
Egorov, Izvestiya Akademii Nauls SSSR, vol. 37, #11, pp. 2277–2279, 1973.

*Primary Examiner*—Hiram H. Bernstein
*Attorney, Agent, or Firm*—Oblon, Fisher, Spivak, McClelland & Maier

[57] ABSTRACT

Thin strip crystals are grown by pulling the growing crystal from the melt, through a thin slit, the walls of which are not wetted by the melt. The stability of growth at the edges of the strip is achieved by maintaining the pressure of the melt adjacent the interface between crystal and melt above a critical level which is such as to cause the meniscus of the melt to be convex on all sides of the growing crystal. The critical pressure is defined as $$2S/b + \sqrt{2Szg}$$

where
 S is the surface tension of the crystallizable material
 b is the thickness of the slit
 z is the density of the melt
 g is the acceleration due to gravity;

and the depth of the slit is at least $(2S/zg)^{\frac{1}{2}}$, preferably $(32S/zg)^{\frac{1}{2}}$ to ensure that a pressure exceeding the critical pressure can be developed and maintained without the liquid spilling out of the slit. The walls of the slit can be parallel or divergent in the direction in which the crystal is pulled, this divergence being necessary with certain materials. An arrangement is disclosed containing a head of the melt for creating the required pressure. An alternative arrangement is disclosed in which actuating devices, such as hydraulic piston and cylinder arrangements, create the pressure.

56 Claims, 37 Drawing Figures

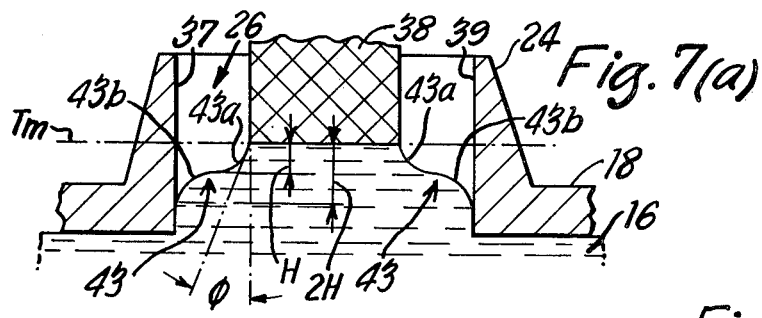
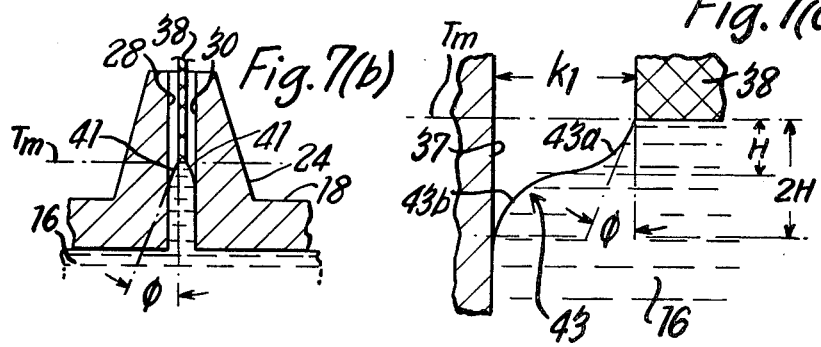
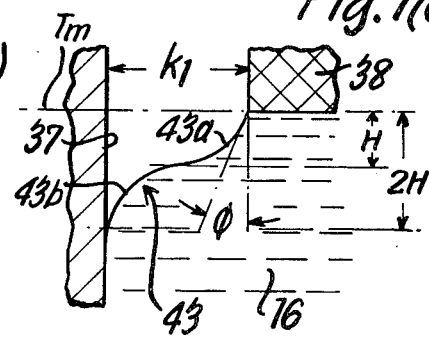
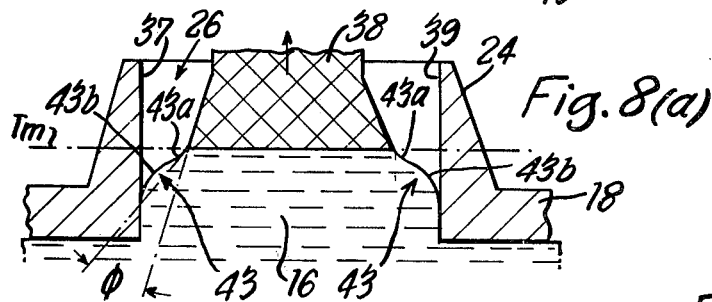
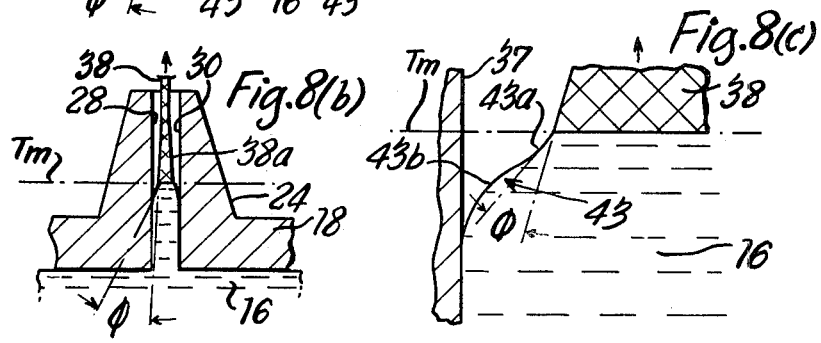
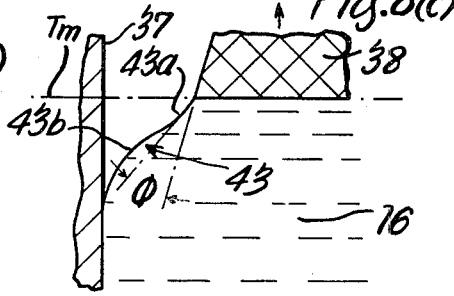

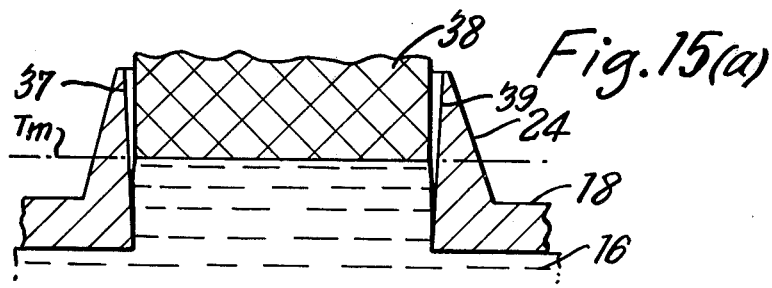
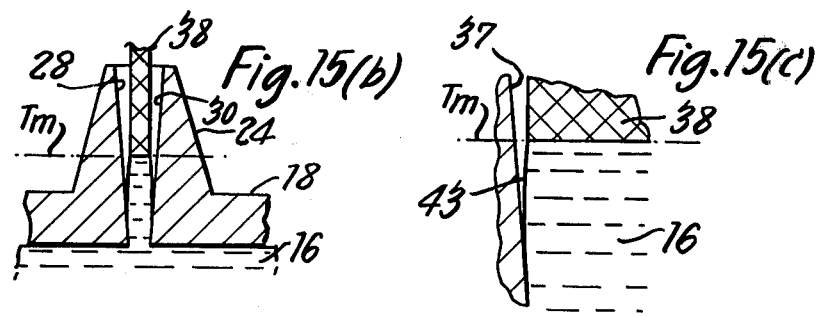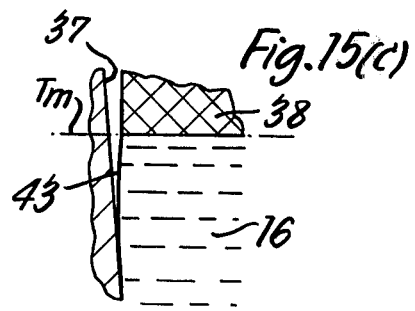
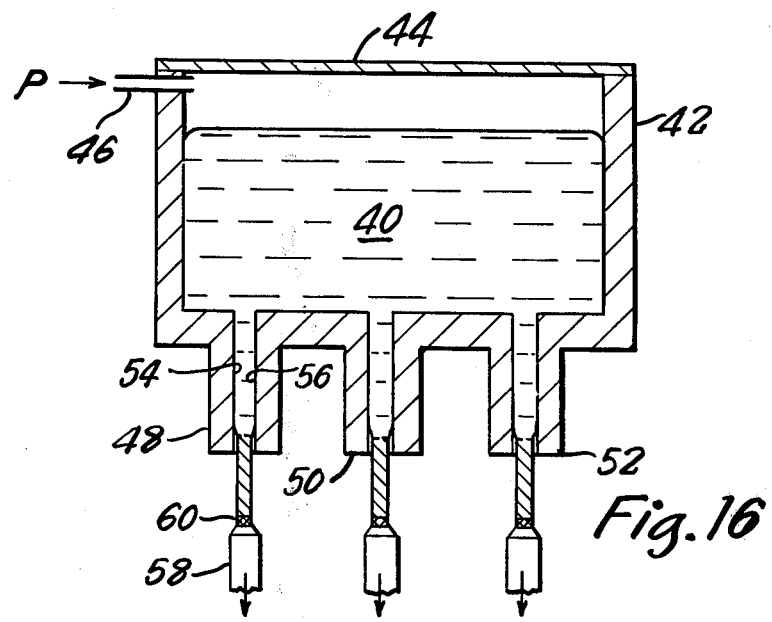

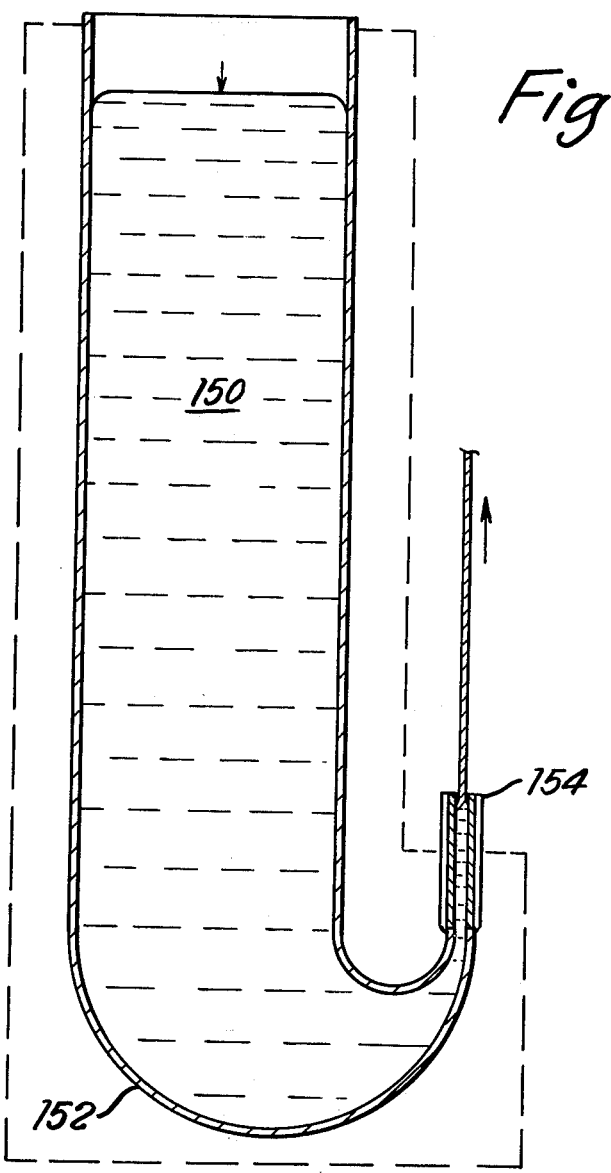

CRYSTAL GROWTH

FIELD OF THE INVENTION

This invention relates to the manufacture of crystals, and is particularly concerned with growing crystals in the form of single crystal strip or ribbon from which single crystal wafers can be cut for use in semiconductor devices.

PRIOR ART

One method of making crystal wafers for use in semiconductor devices has been firstly to grow crystals of relatively thick cross section, for example cylindrical cross section by the well known Czochralski, in which a melt of crystallisable material is formed in a crucible, a seed crystal dipped into the melt, and then the seed crystal pulled from the melt at a slow rate as the required crystal grows. After the crystal has been grown, it is then sliced into the required wafers. This process is disadvantageous in that the slicing operation involves considerable waste of crystal, which is very expensive, and in that two stages are involved in the process, namely, firstly the growing of the crystal and secondly the slicing of it. An example of the Czochralski method can be seen in U.S. Pat. No. 3,647,389. Further examples of this method, in which attempts to obtain more accurate control of the cross sectional area of the growing crystal have been made by growing the crystal through an aperture in a shape forming member, can be seen in U.S. Pat. No. 3,265,469; No. 3,291,574; No. 3,291,650; and No. 3,078,151.

Proposals have also been made in the prior art for the growing of crystals actually in ribbon or strip form. One such method is proposed in U.S. Pat. No. 3,124,489, in which the melt is forced under pressure through a narrow slot in a die and the freezing interface between the melt and the grown crystal is established precisely at the exit to the slot. U.S. Pat. No. 3,124,489 explains that if the point of freezing should move beyond the edge of the slot the cross sectional area of the growing crystal will increase, whereas if the point of freezing should move downwardly within the slot, the growing crystal will jam within the slot thus preventing the growing process from proceeding. Accordingly, very precise control, which is virtually impossible to achieve in practice, of the growth conditions is necessary, particularly the temperature conditions in order for the process of U.S. Pat. No. 3,124,489 to work. Furthermore, U.S. Pat. No. 3,124,489 illustrates in the drawings a concave meniscus of the melt within the die, indicating that the material of the die is wetted by the melt. This is disadvantageous since there will inherently be cross contamination between the material of the die and the material of the melt, resulting in the growth of impure crystals and in a reduction in the life of the die.

An article entitled "Growth of Nondendritic Single-Crystal Ribbons of Germanium" by Don E. Swets which appeared in "Electrochemical Technology" July–August 1967 Pages 385 to 389, proposed that a shape forming member, in the form of a disc, should be floated on the melt. The disc is of a material which is not wetted by the melt and includes a very thin central region containing a slot through which the melt is forced, by the weight of the disc, so as to form a meniscus just above the upper extremity of the slot. The crystal is grown from this meniscus. The ends of the slot are enlarged with the result that the grown crystal is of dumb-bell shaped cross section, the enlargement at the ends of the slot being proposed to minimise variations in the width of the slit due to surface tension effects at the ends of the slot which have been found to arise in the absence of the enlargements. Thus this method suffers from the disadvantage that, although a ribbon like crystal is grown, the edges have to be cut off in view of the dumb-bell shape to provide the required flat wafers. Furthermore, as Swets acknowledges, precise control of the growing conditions, particularly temperature, is necessary to avoid variations in the thickness of the growing ribbon. As previously stated, such precise control is virtually impossible to obtain in practice.

A similar proposal to Swets is disclosed in an article entitled "The Production of Germanium Single Crystals of Predetermined Shape" by Tsivinskii and Stepanov in "Soviet Physics—Solid State" Vol. 7 No. 1 July 1963 Pages 148 to 152. The process described also involves growing ribbon like crystals of dumb-bell shape using a shape former with a slot having enlarged ends. However, the shape former is a cup-like member of material not wetted by the melt, and is forced down into the melt so as to cause the melt to be forced up through a dumb-bell shaped slot in the bottom of the cup. This proposal suffers from the same problems as the Swets method as described above.

An article entitled "Control of Capillary Shaping of Single Crystals during the Growth Process" by Sachkov, Tatarchenko and Levinzon reports on work they have done in connection with the Tsivinskii and Stepanov proposals and acknowledges that they cannot be used for growing particularly thin strips e.g. strips of less than 1 mm thickness.

In an article entitled "Features of the Growth of Thin Germanium Strip by Stepanov's Method with Elevated Melt Pressure in the Shaper", Egorov, Zatulovskii and Chaikin which appeared at pages 2277–2279 of Vol. 37 No. 11, 1973 of "Izvestiya Akademii Nauk SSSR, Seriya Fizicheskaya" report on attempts at growing germanium strip without thickening at the edges (i.e. without the dumb-bell shape) using the Stepanov method. Egorov et al acknowledge that they encountered definite difficulties in attempting to keep the crystallisation front at the necessary height. As explained above, variations in the height or position at which crystallisation is taking place causes variations in the cross section of the growing crystal. Although Egorov et al do give one example whereby they obtained a strip of uniform width, they also explain that in other cases "dagger shaped" strips and strips which became narrower as the process was carried on were produced. In another case, they found that the melt column spread out as the crystallisation front rose above the shaper.

Accordingly, it is considered that attempts which have been made so far to grow ribbon or strip crystals using a shape former with a slot have proved unsuccessful.

An alternative approach to the problem of growing ribbon or strip like crystals is described in an article entitled "Edge Defined Film Fed Crystal Growth" by Chalmers, LaBell and Mlavski which appeared in "Journal of Crystal Growth" Vols. 13/14 1972 Page 84. In this method a film of the melt is formed on the top surface of a shape forming member made of a material which is wetted by the melt. The shape of the surface supporting the film corresponds to the required cross sectional shape of the crystal, and the crystal is grown from this film. The shape former is floated on the melt, and contains a central capillary passageway through which the melt flows to replenish the film as it is crystallised. The problem with this method is that since the material of the shape former is wet by the melt, cross contamination occurs with the result that the crystal produced is impure and the life of the shape forming member is short. The problem of cross contamination is very severe in the case of the growing of silicon crystals.

THE INVENTION

The problem underlying the invention, therefore, is to provide a method and apparatus for growing thin ribbon or strip crystals in which uniform cross section may be achieved and in which the problem of cross contamination between the melt and a shape former may be avoided.

The invention utilises a shape forming member containing a narrow slit. At least the walls of the slit are not wetted by the melt. The growing crystal is pulled from the melt through the slit, and the freezing interface is made within the slit.

The pressure of the melt adjacent the freezing interface is at a level sufficient to cause the meniscus of the crystallisable material to be convex on all sides of the crystal, the depth of the slit being sufficient to permit this pressure to be developed without the melt being forced beyond the outlet end of the slit.

Expressed alternatively, the pressure of the melt in the region of said interface is at a level of at least $$2S/b + \sqrt{2Szg}$$

where
S is the surface tension of the crystallisable material
b is the thickness of the slit
z is the density of the melt
g is the acceleration due to gravity;
and the depth of the slit is at least $$(2S/zg)^{\frac{1}{2}}.$$

Preferably the depth of the slit is at least $(8S/zg)^{\frac{1}{2}}$, more preferably at least $(32S/zg)^{\frac{1}{2}}$.

With such a deep slit, it is possible to permit the position of the freezing interface within the slit to vary without changing, or without significantly changing, the cross section of the grown crystal.

The actual depth of the slit may depend upon the particular crystal being grown. With certain materials, the depth of the slit may be in a range of say 0.9 to 4 cm. However, with other materials, the depth may be as low as 10 mm or even less in certain cases. These depths may be contrasted with the very shallow slits proposed in the prior art discussed above, which slits were generally not more than 5 mm deep and thus with such slits it would with most materials be impossible to create the pressure level referred to above utilised in the present invention without causing the melt to spill over the top of the slit.

Preferably the entire shape forming member is made of material not wetted by the melt. Alternatively, or additionally, a known encapsulant may be utilised as is conventional in growing crystals of certain materials, which encapsulant may serve the additional function of providing a barrier between the shape forming member and the melt.

The slit may be parallel sided, or may be divergent in the direction in which the crystal is pulled. With certain materials, it will be necessary for a divergent slit to be used to enable the required convex shape of the meniscus on all sides of the crystal to be achieved. Whether or not the divergent slit must be used depends upon the angle of contact between the melt and the walls of the slit and the angle at which the melt runs off from the solid crystal. Where the materials do not make it essential that a divergent slit should be used, such a slit may nevertheless be employed for convenience in that the insertion of a seed to begin the growing process will be facilitated.

The crystal may be pulled upwardly or downwardly through the slit, or the slit may be at some angle to the vertical, or may be horizontal, in the latter cases the direction in which the crystal is pulled would be respectively at the same angle to the vertical as the slit or would be horizontal.

When the pressure is increased to the abovementioned level, so that the meniscus convex on all sides of the crystal is produced, the result is that the liquid material below the freezing interface is caused to substantially fill the cross section of the slit. At pressures below this level, the meniscus may have a concave shape immediately adjacent the crystal, at the ends of the slit (although it would of course be convex at portions approaching the point of contact with the wall of the slit) and it is considered that it is the existence of these concave portions which produce unstability in the width of the slit by increasing the pressure to the aforesaid level, it is found that stability of growth in the width direction may be achieved, thus producing uniform cross section crystals.

The thermal conditions in the region of the slit are controlled so that the freezing interface at which crystallisation occurs always lies within the slit. The invention thus allows solidification to take place inside a relatively deep vertical slit in which the liquid is pressurised so that in the absence of the restraining solid above or below the freezing interface it would rise or fall substantially higher or lower in the slit. The pressure in the liquid allows more accurate control of the cross section of the emerging solid ribbon. The pressure also allows freezing to occur at a level well above or below the melt where it is easy to provide adequate cooling to remove latent heat which can be released rapidly when the ribbon is made at a fast rate desirable for improved economics.

One embodiment of apparatus for performing the method according to the invention comprises a growth chamber having mounted therein a crucible containing a charge of crystallisable material, means for heating the material in the crucible to a liquid state and a plate adapted to float on the liquefied charge of crystallisable material and sealed peripherally against the internal surface of the crucible. Part of the plate is of increased thickness and has a narrow slit formed therethrough. At least the material defining the slit is a material which is not wetted by the liquid crystallisable material.

Means is provided for supporting a seed crystal in said slit and drawing the seed crystal in an upward direction in a controlled manner to draw liquid material through a freezing interface to cause the material to crystallise into a monocrystalline ribbon below the seed crystal.

Means is also provided for exerting a downward force on the plate to pressurise the liquid trapped therebelow and to force the liquid material up the slit, the presence of the seed crystal or crystallised material therebelow, in the slit, causing with the increased pressure, the liquid material to substantially fill the cross sectional area of the slit immediately below the freezing interface.

The means for exerting force on the plate floating on the surface of the liquefied charge may comprise a series of fingers which extend down around the growing crystal from a thrust ring to which they are attached, and the ring is forced in a downward direction by mechanical or hydraulic or pneumatic means.

Alternatively the plate may be loaded with one or more weights and means provided within the growth chamber for adding and subtracting weights to adjust the pressure of the liquid.

It will be appreciated that more than one slit may be formed in the plate and by providing appropriate seeding and crystal lifting mechanisms, a corresponding plurality of separate crystalline ribbons can be drawn simultaneously from a single charge of liquid material.

Another embodiment of apparatus for performing the invention conveniently comprises a crucible into which a charge of crystallisable material is placed, means for heating the charge to produce liquid material within the crucible, an exit slit formed in the crucible, at least the material defining the slit being material which is not wetted by the liquid material, the dimensions of the slit being such that the liquefied material will not normally pass into the slit due to surface tension but will only flow thereinto under pressure, means for supporting a seed crystal within the exit slit to make contact with the liquid material therewithin and means for producing relative vertical movement between the exit slit and said seed crystal support, means to withdraw material from the slit in the form of a ribbon of crystal and means for subjecting the liquid material in the slit to sufficient pressure to cause it to substantially fill the cross section of the slit at the freezing interface.

The thermal conditions within the slit are controlled so that the freezing interface always lies within the slit, so that solid crystal material is always present in the slit beyond the growth interface in the direction of pulling.

The apparatus may include a plurality of exit slits and a corresponding plurality of seed crystal support means so that a corresponding number of ribbon crystals may be grown from a single charge of crystallisable material.

The liquid material may be pressurised by sealing the crucible and introducing an inert fluid (which may be a gas) above the liquid material or the required pressure in the slit may be obtained by increasing the depth of liquid material above the slit. Alternatively a mechanically or pneumatically operated plunger may be provided to act on the liquid material in the crucible.

The exit slit (or slits) may be in the base of the crucible. Preferably however the slit is formed at the upper end of one limb of a U-tube of which the crucible forms the other limb.

Figure 13A:
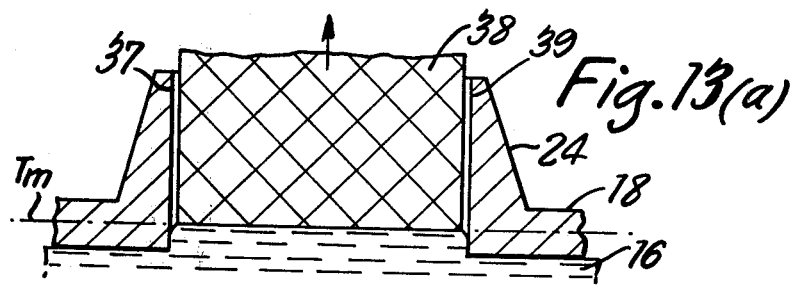
Figure 13B:
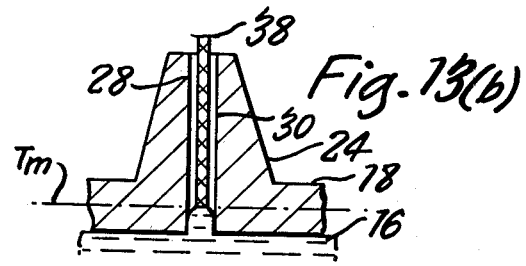
Figure 14A:
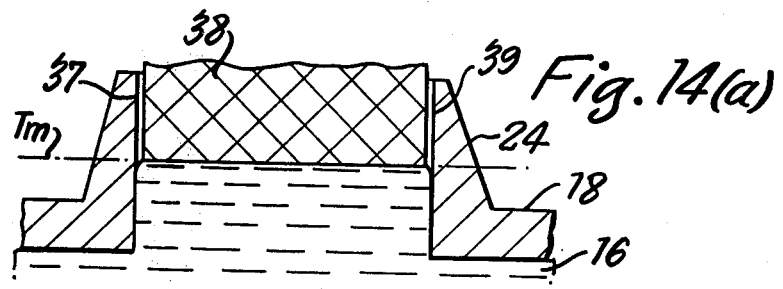
Figure 14B:
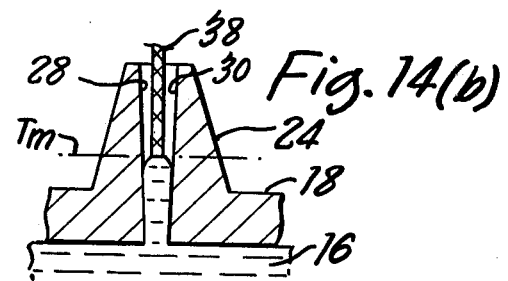
Figures 9A, 9B, 9C:
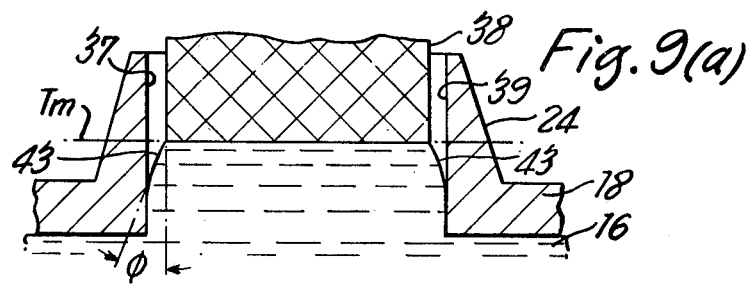
Figure 10A:
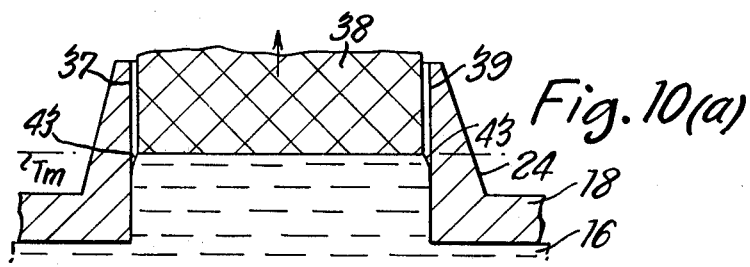
Figures 10B, 10C:
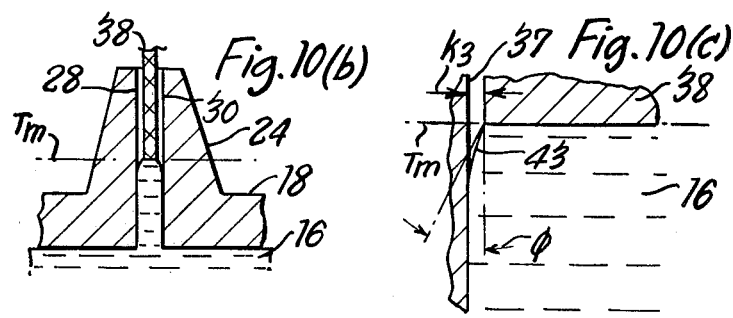
Figure 11A:
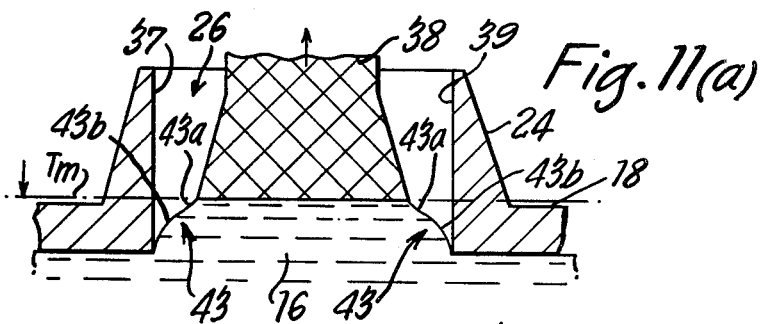
Figure 11B:
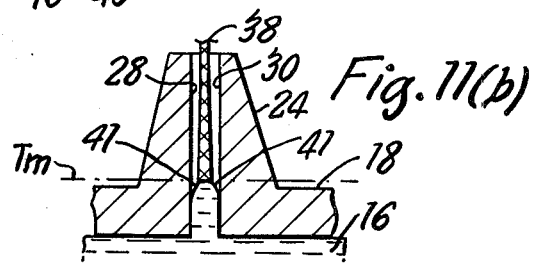
Figure 12A:
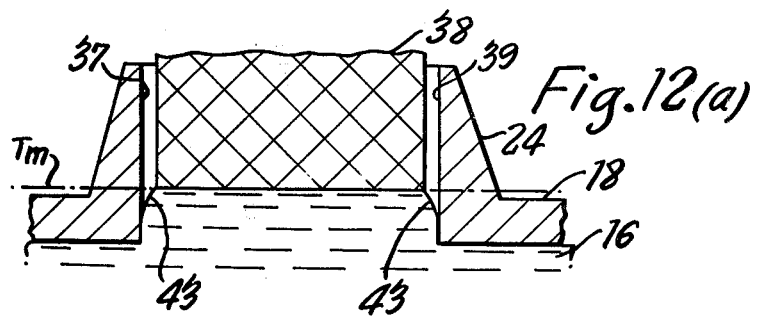
Figure 12B:
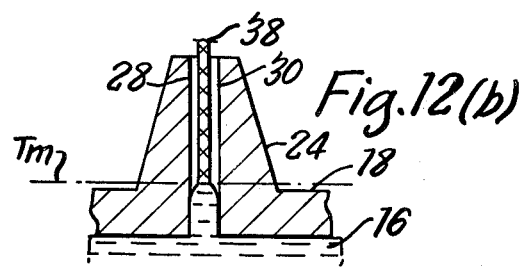
Figure 17:
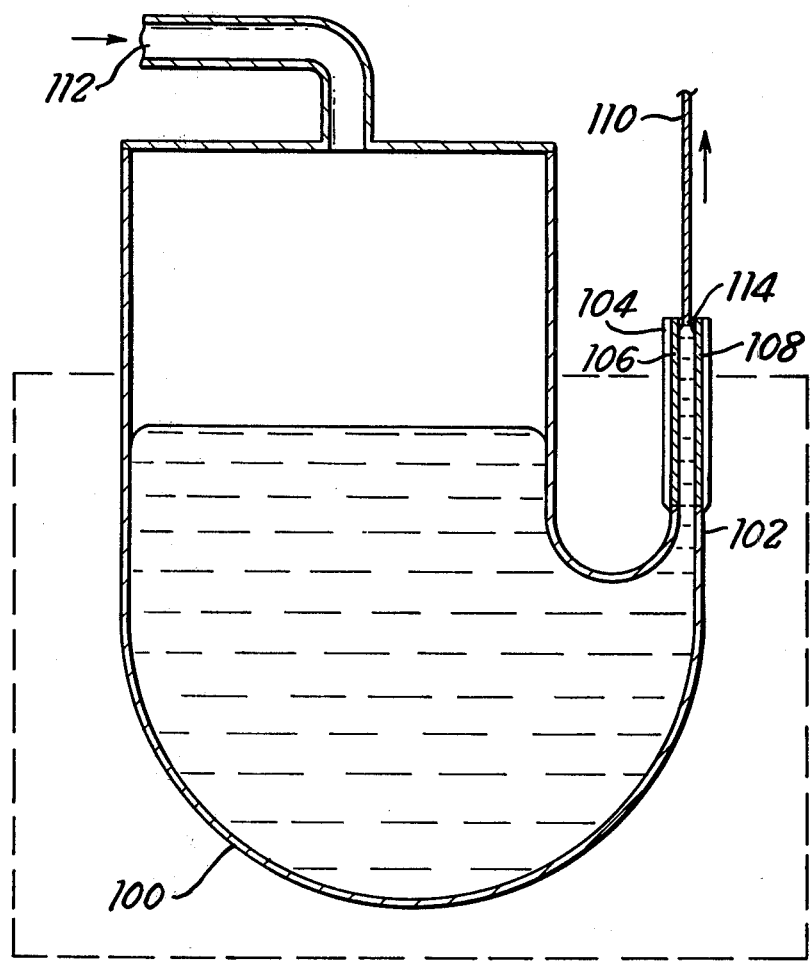

The invention will now be described by way of example with reference to the accompanying drawings in which:

FIG. 1 is a cross-sectional view through a crucible and growth chamber for pulling a ribbon crystal from a liquefied charge of crystallisable material, FIGS. 2 to 10 are diagrammatic sectional views illustrating conditions within the slit at various stages in a process for carrying out the invention, FIGS. 11 to 13 are diagrammatic sectional views illustrating conditions within the slit at different stages in another process for carrying out the invention, FIG. 14 is similar to FIG. 10 but shows an alternative form of slit, FIG. 15 is also similar to FIG. 10 and shows another alternative form of slit, FIG. 16 is a cross-sectional view through a sealed crucible from which liquid crystallisable material may be pulled to form ribbon crystals, and FIGS. 17 and 18 are cross-sectional views through alternative embodiments of crucible from which ribbon crystals may be grown.

In FIG. 1 there is shown a growth chamber 10 into which an inert gas can be pumped through inlet 12 if an inert medium is required around the crystallising zone or through which atmosphere can be evacuated from the interior of the growth chamber to produce a vacuum.

Centrally within the chamber 10 is located a crucible 14 in which is carried a charge of crystallisable material 16 which is heated by any convenient heating means such as a heating coil 11 or R.F. induction heating means, a resistive heating element embedded in or forming part of the crucible 14.

Located on the liquid pool of crystallisable material 16 and floating thereon is a plate member 18 which is sealingly attached to the lower end of a sleeve 20 which is a clearance fit within the crucible 14.

A seal 22 is shown between the sleeve 20 and the crucible 14.

Approximately centrally of the plate 18 is formed a region of increased thickness 24 which extends above the plate 18. The region 24 tapers towards its upper end to facilitate cooling the liquid material at the upper end of the slit 26 which is formed therein. The slit 26 has two longer parallel sides 28 and 30 as is described later the sides of the slit 26 may diverge for use with some melt materials such as silicon but have been shown and are described as being parallel in FIG. 1 simplicity. The thickness of the slit is not shown to scale in the drawing for reasons of clarity.

Additional cooling is provided in the form of a manifold 32 for supplying cooling gas under pressure to the growth zone. A gas supply pipe is shown at 34.

The material from which at least the inside of the region of increased thickness 24 (and preferably the whole of plate 18) is formed is selected as being one which is not wetted by the liquid crystallisable material 16.

The thickness of the slit 26 between the parallel faces 28 and 30 is typically less than 1 mm and by virtue of the surface tension of the liquid material 16, the latter will not normally rise into the slit as it would if the liquid material 16 wetted the material from which the slit is formed.

In order to get the liquid material to rise into the slit, plate 18 is depressed in a downward direction by fluid pressure (e.g. hydraulic or air) actuated piston and cylinder devices 31 and fingers 33 which bear at their lower ends on the upper surface of the plate.

Alternatively, weights (not shown) may be placed on the plate 18 and means (not shown) provided within the chamber 10 controlling the addition of the weights to the plate to adjust the pressure as required.

An aperture is formed at the upper end of the chamber 10 to receive a crystal lifting rod 36 at the lower end of which is mounted a seed crystal 38 which determines the orientation of the growing crystal. The seed crystal 38 is in the form of a crystal platelet the width of which is less than the spacing between the opposed faces 28 and 30 and the length of which is slightly less than the length of the slit. In this way the seed crystal 38 can be lowered by the rod 36 into the slit between the faces 28 and 30 to make contact with the liquid material initially at the lower end of the slit. After seeding-on has occurred the pressure in the liquid material is increased by actuating the devices 31 or, for example adding weights to the plate 18 so as to force the liquid out to the ends of the slit. The crystal is then withdrawn by raising the pullrod 36. The cooling is arranged so that the freezing interface remains in the slit. Economic advantages accrue from pulling the ribbon out fast and the cooling is arranged to remove the larger quantity of latent heat which is released as material is pulled and therefore frozen more rapidly.

A ribbon of crystal can be pulled from the slit by continuing to raise the rod 36 and at the same time maintaining constant the pressure in the liquid. The cross section of the pulled crystal ribbon can be made to conform to that of the slit by ensuring that the pressure below the freezing interface is sufficient to force the liquid immediately below the interface out to the full width of the slit (i.e. the meniscus is caused to be convex on all sides of the crystal) against the tendency arising from surface tension for the liquid to remain distant from the walls of the slit.

The apparatus shown in FIG. 1 is particularly suitable for growing ribbon crystals of silicon. Suitable materials from which the crucible 14 and plate 18 may be formed are Beryllia and cerium sulphide. Where silicon is being crystallised, the atmosphere within the growth chamber 10 is preferably Argon or another inert gas or alternatively a vacuum is formed.

Although only one slit is shown in the plate 18, the embodiment can be modified by providing additional thickened regions of the plate 18 to accommodate additional slits from which ribbon crystals can be pulled using additional pull rods (not shown).

The various steps in establishing the process according to the invention are illustrated in FIGS. 2 to 10. In these drawings, the same reference numbers as used in FIG. 1 are used, but in addition the two minor walls of the slit are indicated by reference numbers 37 and 39.

Figure 2A:
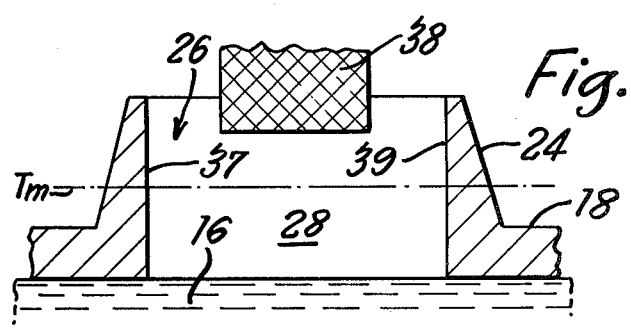
Figure 2B:
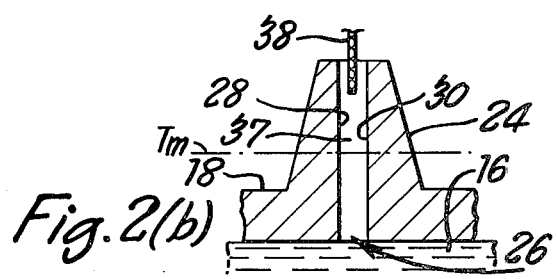

In FIG. 2, initial conditions are shown. The seed 38 is being lowered into the slit 26. The broken line Tm indicates the position of the freezing isotherm i.e. there is a temperature gradient between the lower and upper ends of the slit and the line Tm indicates the position at which the temperature is such that the melt will freeze. As can be seen, the melt has not entered the slit at all in FIG. 2 and thus, in the conditions shown in FIG. 2, the pressure of the melt is insufficient to overcome the surface tension forces which, due to the fact that the walls of the slit are not wetted by the melt, act in a direction to oppose entry of the melt into the slit. It can be seen from FIG. 2, that FIG. 2B shows the slit in the direction as seen in FIG. 1 whereas FIG. 2A shows the slit as seen in a perpendicular direction.

Figure 3A:
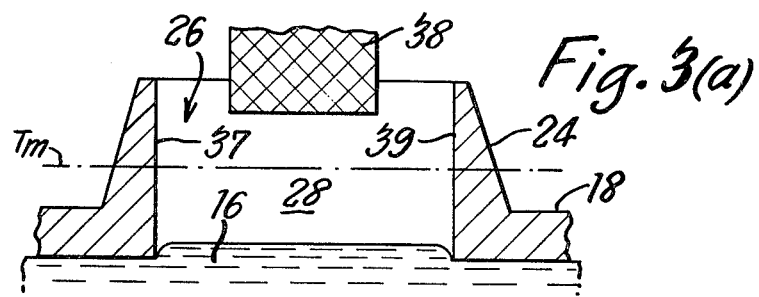
Figure 3B:
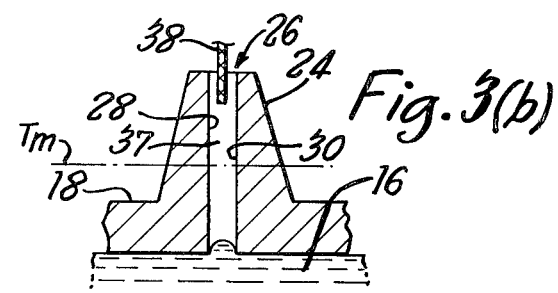
Figure 4A:
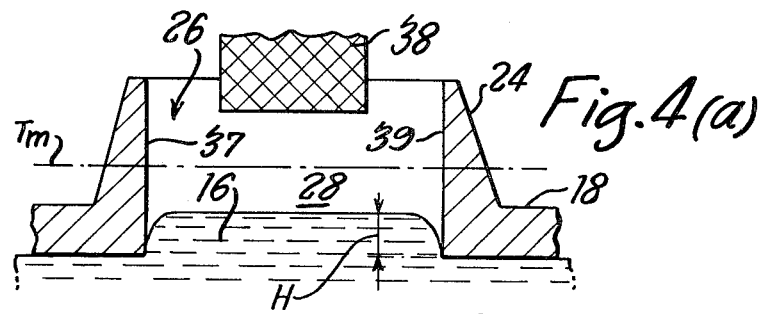
Figure 4B:
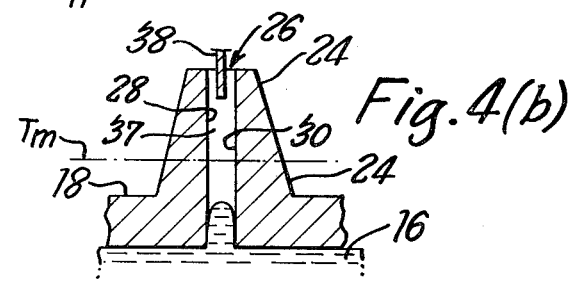

With the seed in the position shown in FIG. 2, the pressure is gradually increased until as shown in FIG. 3 a meniscus begins to form as the melt starts to bulge into the slit 26. The pressure increase is continued and as shown in FIG. 4 a meniscus is just fully formed in the bottom of the slit. The height of the meniscus is represented by H, as seen in FIG. 4.

The pressure necessary for producing the conditions shown in FIG. 4 is defined as $Pc_1$, and $$Pc_1 = 2S/b \tag{1}$$

Although in FIG. 2 the pressure is produced by the actuating devices 31, it is possible, as will be described subsequently, to produce the pressure by a suitable head of the melt. The critical head necessary to produce the conditions of FIG. 4 ($hc_1$) is as follows:

$$hc_1 = 2S/zgb \tag{2}$$

In the above formulae,
b is the slot thickness (distance between major faces 28 and 30)
S is the surface tension of the melt
z is the density of the melt
g is the acceleration due to gravity.

Figure 5A:
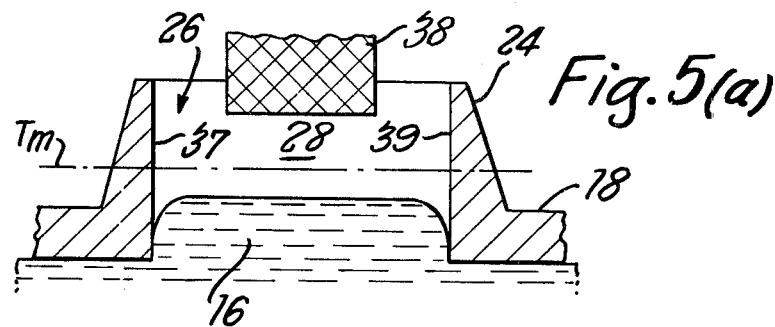
Figure 5B:
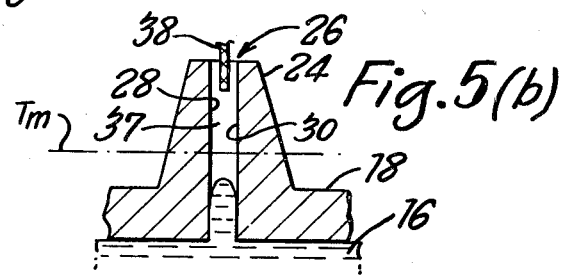
Figure 6A:
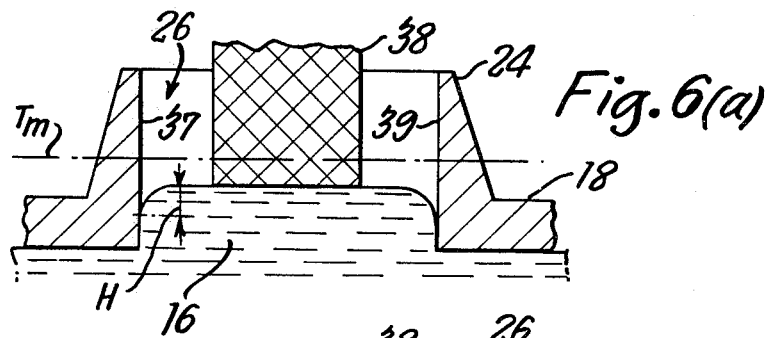
Figure 6B:
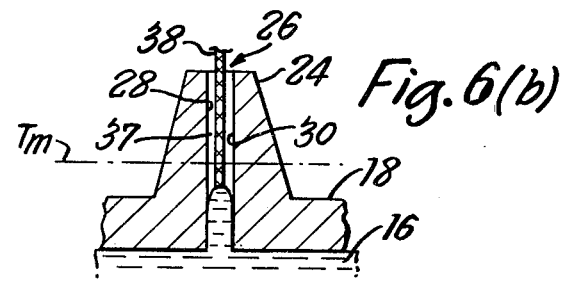

With reference to FIG. 5, the process is continued by contuing to increase the pressure above $Pc_1$ until the top of the meniscus is just below the freezing isotherm. Thereafter, as shown in FIG. 6, the seed 38 is pushed downwards into the melt. FIG. 6 in fact shows a transient state because the portion of the seed which goes below the freezing isotherm Tm will melt immediately, thus producing the conditions shown in FIG. 7. As can be seen in FIG. 7B, the meniscus includes portions 41 which extend between the major walls 28 and 30 of the slit and the major surfaces of the seed 38, which portions 41 are entirely of convex shape. However, as seen in FIGS. 7A and 7C, the portions 43 of the meniscus extending between the minor surfaces 37 and 39 of the slit and the edges or minor surfaces of the seed crystal include a concave portion 43a adjacent the seed crystal and a convex portion 43b adjacent the walls 37, 39 of the slit. It is considered that it is the existence of this concave/convex shape of the meniscus portions 43, as a result of which the melt does not substantially completely fill the ends of the slot which has resulted in instability in the width of the grown crystal as encountered in the prior art discussed above. It is considered that the precise shape of the meniscus portions 43 depends upon various factors, including the angle of contact $\theta$ between the meniscus and the walls of the slit, the run off angle $\phi$ between the melt and the seed 38 or growing crystal (as used herein the expression "run off angle" is defined as meaning that angle, measured within the melt, between the surface of the melt and the plane of the minor face, or edge, of the seed or growing crystal), and the distance K between the edge of the seed 38 and the adjacent minor wall 37 or 39 of the slit 26.

It will be seen from FIG. 7B, that although the same run off angle $\phi$ applies in the case of the meniscus portions 41, the geometry of the system as seen in the direction shown in FIG. 7B is such that the portions 41 are wholly convex.

In order to eliminate the concave portions 43a of the meniscus shown in FIG. 7, the pressure in the melt is increased further. As the pressure rises, it has the tendency of increasing the angle $\phi$, but to counteract this tendency and to maintain the angle $\phi$ at its natural equilibrium state, the crystal grows wider as shown at 38a in FIG. 8. There will additionally be a tendency for the crystal to grow thicker, but this effect is small, since the liquid surface in the narrow dimension is already all convex.

The increase in pressure is continued, and eventually, as shown in FIG. 9, the melt becomes all convex i.e. the portion 43a of the concave shape have been eliminated due to the increase in pressure and the outward growth of the crystal.

If it is assumed that the natural height of the meniscus, before seed-on, is H as shown in FIG. 4 and that the height of the concave portion 43a of the meniscus as shown in FIG. 7 is also H, the critical pressure $Pc_2$ necessary to achieve the conditions shown in FIG. 9 may be expressed as follows:

$$Pc_2 = P + Hzg \qquad (3)$$

where P is the pressure applied to the liquid to achieve the conditions shown in FIGS. 5 and 6.

It will thus be understood that the minimum value of $Pc_2$ may be expressed as:

$$\min.Pc_2 = Pc_1 + Hzg \qquad (4)$$

or $$\min.Pc_2 = 2S/b + \sqrt{2Szg} \qquad (5)$$

The minimum head of liquid for achieving this pressure (if head of melt is utilised for developing it) may be expressed as follows:

$$hc_2 = 2S/zgb + (2S/zg)^{\frac{1}{2}} \qquad (6)$$

In practice the pressure will be increased still further beyond the value assumed for achieving the conditions shown in FIG. 9 so that the distance K decreases even further and so that, if any temperature variations arise causing the freezing isotherm Tm to shift upwardly of the slit, the pressure within the melt immediately adjacent the freezing interface is maintained above the level necessary to maintain the all convex conditions shown in FIG. 9.

The depth d of the slit 26 must be great enough to permit the abovementioned pressures to be developed without causing the melt to flow out of the outlet end of the slit. Thus, from consideration of FIG. 7, it will be recognised that the absolute minimum depth of the slot is approximately 2H, but this would only be useful where seed-on is effected with the meniscus in the position shown in FIG. 4 and with the freezing isotherm correspondingly closer to the inlet end of the slit 26. In practice therefore the depth of the slit is preferably at least 4H, so that the freezing interface may move up and down the slit. Since $$H \approx (2S/zg)^{\frac{1}{2}} \text{ minimum slot depth} \approx (2S/zg)^{\frac{1}{2}} \text{ working slot depth} \approx (2S/zg)^{\frac{1}{2}} \qquad (7)$$

The following Table 1, worked out from the above formulae, will give numerical examples for growing germanium and silicon crystals.

Table 1

| | | | Slot Depth | |
|---|---|---|---|---|
| | S dynes $cm^{-1}$ | z gm $cm^{-3}$ | min slot depth | cms working slot depth |
| Germanium | 600 | 5.57 | 0.94 | 1.88 (say 2cm) |
| Silicon | 720 | 2.4 | 1.56 | 3.12 (say 3cm) |

$g = 981$ cm sec$^{-2}$

Table 2

| | Pressure to cause liquid to enter slot ($Pc_1$) where b equals .0254 cm | | | |
|---|---|---|---|---|
| | S dynes $cm^{-1}$ | z gm $cc^{-3}$ | $Pc_1$ dynes/$cm^2$ | $hc_1$ cms |
| Germanium | 600 | 5.57 | 47244 | 8.65 |
| silicon | 720 | 2.4 | 56692 | 24.07 |

$g = 981$ cm sec$^{-2}$

Table 3

| | Critical pressure to produce all convex melt, assuming seed-on takes place at $Pc_1$ and that b equals .025 cm | | | |
|---|---|---|---|---|
| | S dynes $cm^{-1}$ | z gm/cc | $Pc_2$ dynes/$cm^2$ | $hc_2$ cms |
| Germanium | 600 | 5.57 | 49833 | 9.12 |
| Silicon | 720 | 2.4 | 58506 | 24.85 |

$g = 981$ cm sec$^{-2}$

As can be seen from the above tables, it is not necessary with these materials for the slot depth to exceed 4 cm, but nevertheless the depth of the slot is considerably greater than proposed in the prior art discussed above. It should be noted that by "depth" is meant the distance from the inlet to the output of the slot and that, since the crystal can be pulled in the horizontal direction, or at other angles to the vertical, in which event the slot would extend either horizontally or at such other angle to the vertical.

It can also be worked out from the above formulae that in the case of growing crystals of gallium phosphide the minimum slot depth would be 0.94 cm, the working slot depth would be 1.88 cm (say 2 cm) and the slot depth need not exceed 4 cm. In the case of gallium arsenide crystals, the minimum slot depth would be 0.83 cm, the working slot depth would be 1.6 cm (say 2 cm) and the slot depth need not exceed say 4 cm.

In practice, the thickness of the slit may be selected from a wide range of values. A preferred range is 0.002 cm to 0.11 cm. A particularly preferred range of values for the thickness of the slit is 0.02 to 0.04 cm. Using the above formulae, suitable values of pressure can be worked out for the different slot thicknesses. The following Table 4 gives suggested ranges of working pressures, for different materials, for the above suggested ranges of slot thickness:

Table 4

| | Suggested working pressure ranges | |
|---|---|---|
| Crystal material | Slot thickness b in range .02 to .04 cm | Slot thickness b in range 0.002 to 0.11 cm |
| Germanium | 67,000 to 39,000 dynes/$cm^2$ | 490,000 to 19,000 dynes/$cm^2$ |
| Silicon | 77,000 to 43,000 dynes/$cm^2$ | 580,000 to 19,000 dynes/$cm^2$ |
| Gallium phosphide | 51,000 to 29,000 dynes/$cm^2$ | 370.000 to 14,000 dynes/$cm^2$ |
| Gallium arsenide | 51,000 to 30,000 dynes/$cm^2$ | 370,000 to 15,000 dynes/$cm^2$ |

It will be recognised from the above that the smaller the value of b (slit thickness) the larger must be the pressure to create the required conditions in accordance with the invention. It will also be noted from the above Table 4 that in the case of the materials and slot thicknesses mentioned the working pressures are always substantially above 10,000 dynes/$cm^2$. It can be worked out from the above equations, that in the case of gallium phosphide, grown in a slit of thickness 0.1016 cm, the minimum value of $Pc_2$ which could operate would be 10,777 dynes/cm$^2$. Thus, generally, the pressure utilised in the invention for creating the all convex shape of the meniscus will be above 10,000 dynes/cm$^2$.

In the embodiments so far described, the freezing isotherm Tm is maintained at a substantially constant level, and the concave portions 43a of the meniscus eliminated by actually increasing the pressure applied to the melt, in an alternative embodiment, the process is begun in the manner illustrated in FIGS. 2 to 7, but thereafter, instead of increasing the pressure applied to the melt, the temperature conditions are adjusted to lower the freezing isotherm Tm. Since pressure increases with depth into the molten material, this results in an increase in the pressure of the melt in the region of the interface, and thus the crystal grows outwards as shown in FIG. 11. If the freezing isotherm is lowered still further, a point is reached, as shown in FIG. 12, at which the all convex shape of the meniscus is achieved, the pressure within the liquid adjacent the interface being at the level $Pc_2$ at this time, and further lowering of the isotherm Tm as shown in FIG. 13 causes $Pc_2$ to be exceeded thus achieving stable growth conditions similar to those shown in FIG. 10, but at a lower position in the slit. It will be appreciated that in the case of FIG. 13, the freezing isotherm cannot be permitted to move too far above the position shown due to temperature fluctuations as the process is carried on since otherwise the pressure in the melt in the region of the interface will decrease below $Pc_2$, resulting in unstable growth.

Variation of the position of the freezing isotherm may be used solely to produce the required pressure $Pc_2$, or may be used in conjunction with variation of the pressure actually applied to the liquid to achieve $Pc_2$.

In the embodiment shown in FIG. 14, the major walls 26 and 28 of the slit are divergent in the direction in which the crystal is pulled. This is a convenience in facilitating the insertion of the seed crystal of a material which can be grown in a parallel sides slit. Although with this arrangement, movement of the freezing interface up and down the slot will result in variations in the thickness of the ribbon crystal, these variations may in practice be very small since a very slight angle of divergence between the faces 26 and 28 would normally be chosen, for example as angle as low as 10 minutes might be used. On the other hand, angles of up to say 2 degrees may be used. Although in FIG. 14, the minor faces or walls 37 and 39 are shown as parallel, these could also diverge, if desired at an angle similar to that between the major surfaces 26 and 28, but divergence of the minor walls 37, 39 would make little difference to the convenience of inserting the seed crystal since the seed crystal would normally be substantially smaller in width than the spacing between the walls 37 and 39.

In the case of some materials, however, the invention may only be carried out where the cross section of the slit increases in the direction in which the crystal is pulled. Whether or not divergence is necessary is dependent upon the relationship between the angles $\theta$ and $\phi$. Divergence is necessary in the following cases:

1. $\theta = \phi = 0$. This is typical of growing gallium phosphide crystals through a slit whose walls are of silicon nitride. The encapsulated boric oxide is necessary in this case (liquid encapsulants are well known in the art).

2. $\theta > \phi$. An example is the growing of a silicon crystal in a slit whose walls are made of Beryllia.

When $\phi > \theta$ divergence is not necessary but is convenient as illustrated in FIG. 14.

FIG. 15 illustrates a case in which divergence of the walls of the slit is necessary. As shown both the walls 26, 28 and the walls 37, 39 diverge. FIG. 15C shows that the run off angle $\phi$ is zero and the angle of contact between the melt and the wall of the slot is also zero. Consideration of this figure will reveal that unless the walls are divergent, the all convex shape of the meniscus cannot be achieved. Where the relationship between the angles $\theta$ and $\phi$ dictates that divergent walls should be used, such divergence must be applied to all four walls of the slit as shown in FIG. 15. The angle of divergence in this case may be in the range 2 to 20 degrees, for example, depending upon the particular materials used.

The divergence between the walls, both when necessary and when not strictly necessary, facilitates the insertion of the seed crystal (as previously indicated in connection with FIG. 14) and in addition reduces the risk that the grown crystal may stick within the slit.

The following Table 5 will summarise the necessity or otherwise of divergence in the walls of the slit for certain combinations of materials:

Table 5

| Melt | Slot Material | Approx. $\theta°$ | Approx. $\phi°$ | Divergence |
|---|---|---|---|---|
| Germanium | Graphite | 0 | 16 | not necessary |
| Silicon | Beryllia | 40 | 21 | necessary |
| Silicon | Thoria | 85 | 21 | necessary |

Numerous different types of crystal can be grown using the system according to the invention. The following Table 6 will give some examples of crystals which can be grown and suitable materials for the shape former 24. The same materials may be used for the crucible as for the shape former.

Table 6

| Melt | Shape former 24 and crucible | Comments |
|---|---|---|
| Silicon | Beryllia | |
| | Yttria | |
| | Thoria | |
| | Cerium sulphide | |
| Germanium | Graphite | |
| | Beryllia | |
| | Yttria | |
| | Thoria | |
| | Cerium sulphide | |
| | Titanium Nitride | |
| Copper | Graphite | |
| Aluminum | Graphite | |
| Gallium phosphide | Silicon nitride | |
| | Graphite | These materials |
| Gallium arsenide | Silica | need encapsulant, |
| | Silicon carbide | preferably boric |
| | Beryllia | oxide |

The slit 26 may have various widths (the distance between the minor walls 37 and 39), for example typical widths would be in the range 2 to 3 cm, but this is by no means a limitation on the scope of the invention.

An alternative embodiment is shown in FIG. 16 in which the process described in FIG. 1 is inverted. To this end the charge of liquid crystallisable material 40 is contained within a crucible 42 the upper end of which is sealed by a plate 44. An inlet pipe 46 allows an inert gaseous medium to be pumped into the space above the charge 40 to generate a positive pressure within the crucible 42.

The charge 40 may be compressed alternatively by removing the plate 44 and inserting a suitable plunger (not shown) into the crucible and loading the plunger so as to maintain a constant force acting in a downward direction on the charge of material 40.

Although not shown, means is provided for heating the charge of material 40 so as to maintain it in a liquid condition throughout the growing process.

The lower end of the crucible 42 is formed with three outlets 48, 50 and 52. Each of the outlets is similar to the others and only outlet 48 will therefore be described in detail.

A slit is formed in the outlet with a pair of opposed parallel faces 54, and 56 which are typically spaced less than 1 mm. The length of the slit measured parallel to the faces 54 and 56 is very much greater than the width between the faces.

A material is selected for at least the inside of the slit which is not wetted by the liquid material 40 so that surface tension forces prevent the liquid from normally entering the slit in the outlet 48. However when a positive pressure is applied above the liquid 40 (or force is applied to a plunger if employed), the pressure built up within the liquid 40 will cause the latter to enter the outlet slits and by adjusting the pressure or force applied to the liquid 40, the latter can be forced down the slits to a point when it is stopped by the presence of the solid seed.

Alternatively of course the seed crystal may be seeded-on at the upper end of the slit and grown out to occupy the slit area at which stage the pressure can be increased to force the liquid material above the interface to more completely fill the slit section as described with reference to FIGS. 2 to 15.

A seed crystal support 58 is provided for each slit having arranged thereon an elongate crystal platelet seed 60 which is dimensioned so as to just fit within the co-operating slit. The crucible 42 is lowered on to the support 58 (or the latter is raised) until the seed crystal 60 enters the appropriate slit, and seed-on between the liquid material within the slit and the seed crystal 60 is achieved as described above, by adjusting the thermal conditions surrounding the interface to cause freezing along a horizontal isotherm lying within the length of the slit.

The pressure of the liquid material is then increased and simultaneously the support 58 is slowly lowered away from each slit or the crucible 42 is slowly raised relative to the supports (or both) so as to effectively draw from the slit a crystal ribbon, the orientation of which is determined by the seed crystal 60.

During this pulling process, the increased pressure above the liquid 40 (or the force acting on the plunger if employed), is maintained substantially constant and the thermal conditions at the lower end of the slit are adjusted so as to ensure that the freezing interface remains within the slit. If not so, the liquid material would leave the slit under the increased pressure.

As described with reference to the FIG. 1 embodiment additional cooling may be provided by the use of gas jets or the like surrounding the lower end of the outlet or outlets containing the slit or slits so as to remove the latent heat more rapidly and allow the crystallisation process to be carried out at a greater rate.

Although not shown the entire arrangement of FIG. 16 is contained within a growth chamber which is subjected to a lower pressure than that within the sealed crucible 42 (if gaseous pressure is used above the liquid 40), a suitable gaseous medium being employed depending on the nature of the material being pulled from the melt.

A third embodiment is illustrated in FIG. 17 which combines some of the features of each of the two previous embodiments.

In FIG. 17 the crystallisable liquid material is contained within a heated, closed vessel 100 which possesses a side arm 102 leading to the vertical slit 104, which is lined with a non-wetting material 106, 108 and from which the crystalline ribbon 110 can be drawn. Inert gas is admitted to the system via the port 112 to maintain a constant pressure at the growth interface 114. This embodiment possesses the advantage of vertically upward withdrawal of the crystal ribbon without the necessity for sealing and loading a plate within the crucible used to apply pressure in FIG. 1. Cooling can readily be applied to the emergent ribbon to remove latent heat of crystallisation.

For materials of suitable surface tension the required pressure can be obtained by an appropriate head of the liquid material. In FIG. 18 the crystallisable liquid 150 is contained in an open vessel 152 extending above the withdrawal slit 154. After introducing the seed crystal into the slit, the required pressure is obtained by adding material to the melt until the required depth is obtained in the column 152.

By the addition of suitable quantities of the material (either in liquid or solid form) to the column 152 the process may be operated continuously.

For silicon, assuming a surface tension of 720 dynes/cm$^2$ at 1420° C., a suitable pressure at the interface is of the order of 0.5–1 lb/in$^2$ which can be obtained with a liquid height in the range 14.5–29 cm as previously described.

Since the pressures involved are relatively low the vessel either the pressure vessel shown in FIG. 17 or the column in FIG. 18 may be made of high purity silica (a preferred material for containing molten semiconductive silicon) possibly supported in the hot regions by graphite. The non-wetting slit liner material may for example be Beryllia or cerium sulphide. The whole apparatus is, of course, contained within a suitable vessel for supporting an inert atmosphere or a vacuum within which the process can be carried out, without contamination.

It will be appreciated that the invention may be used even when a liquid encapsulant is required to prevent volatile constituents of a liquefied crystallisable material from disassociating. Such is the case when, for example, gallium phosphide is in liquid form when it is necessary to employ boric oxide as an encapsulating layer. If the apparatus of the present invention is required to be used for growing gallium phosphide crystals, the crucible 14 of FIG. 1 must contain a layer of boric oxide above and below the plate 18 at least to a depth equivalent to that of the region of enlarged thickness 24. In the FIG. 16 embodiment, the whole crystal 42 must be submerged in a bath of boric oxide and in the case of the FIG. 17 and FIG. 18 embodiments a layer of boric oxide must be formed above the silicon reservoir and a bath of boric oxide must be provided at the upper end of the capillary slit. It will be understood that for growing gallium phosphide, the entire apparatus must be contained in a suitable pressure vessel and the process conducted in the presence of inert gas for example nitrogen of about 100 atmosphere pressure.

Where a suitable material for defining the slit in any of the embodiments cannot be found (i.e. a material which does not react with the liquid crystallisable material and which is not wetted by that material), a fluid barrier may be formed within the slit by using a liquid which isolates the melt from the slit or by employing a porous material to define the slit and forcing a suitable fluid such as an inert gas through the porous walls of the slit to form a protective gaseous film on the inside surfaces of the slit. When crystallising materials such as silicon a material for forming a fluid barrier between the silicon and at least the slit may be selected from the following list, calcium chloride, calcium fluoride, barium chloride, barium fluoride, lithium chloride, magnesium chloride, magnesium fluoride, binary and ternery salt mixtures of the above and eutectic mixtures such as CaO Al$_2$O$_3$ 2SiO$_2$:2CaO MgO 2SiO$_2$. Thus, the limitations in the following claims that the walls of the slit are not wetted by the melt should be construed broadly to encompass these arrangements.

What we claim is:

1. In a method of growing a crystal in the form of a thin strip, wherein the growing crystal is pulled from a melt of the crystallisable material through a narrow slit whose walls are not wetted by the melt, the freezing interface between the crystal and the melt is within said slit, the improvement that the pressure of the melt adjacent said interface is at a level of at least $$2S/b + \sqrt{2Szg}$$

where
S is the surface tension of the crystallisable material
b is the thickness of the slit
z is the density of the melt
g is the acceleration due to gravity
and the depth of the slit is at least $(2S/zg)^{\frac{1}{2}}$.

2. A method according to claim 1, wherein the depth of the slit is at least $(8S/zg)^{\frac{1}{2}}$.

3. A method according to claim 1, wherein the depth of the slit is at least $(32S/zg)^{\frac{1}{2}}$.

4. A method according to claim 1, wherein the crystal is germanium.

5. A method according to claim 4, wherein the depth of the slit is at least 0.94 cm.

6. A method according to claim 5, wherein the depth of the slit is not greater than 4 cm.

7. A method according to claim 5, wherein the depth of the slit is about 2 cm.

8. A method according to claim 5, wherein the depth of the slit is about 1.88 cm.

9. A method according to claim 4, wherein the thickness of the slit is in the range 0.002 to 0.11 cm and the pressure of the melt adjacent said interface is in the range 490,000 to 19,000 dynes per square cm.

10. A method according to claim 9, wherein the thickness of the slit is in the range 0.02 to 0.04 cm and said pressure is in the range 67,000 to 39,000 dynes per square cm.

11. A method according to claim 4, wherein the walls of the slit are made from a material selected from the group graphite, Beryllia, yttria, thoria, cerium sulphide and titanium nitride.

12. A method according to claim 1, wherein the crystal is silicon.

13. A method according to claim 12, wherein the depth of the slit is at least 1.56 cm.

14. A method according to claim 13, wherein the depth of the slit is not greater than 4 cm.

15. A method according to claim 14, wherein the depth of the slit is about 3 cm.

16. A method according to claim 14, wherein the depth of the slit is about 3.12 cm.

17. A method according to claim 12, wherein the thickness of the slit is in the range 0.002 to 0.11 cm and the pressure of the melt adjacent said interface is in the range 580,000 to 19,000 dynes/cm$^2$.

18. A method according to claim 17, wherein the thickness of the slit is in the range 0.02 to 0.04 cm and said pressure is in the range 77,000 to 43,000 dynes/cm$^2$.

19. A method according to claim 12, wherein the walls of the slit are made from a material selected from the group Beryllia, yttria, thoria, cerium sulphide and titanium nitride.

20. A method according to claim 1, wherein the crystal is gallium phosphide.

21. A method according to claim 20, wherein the depth of the slit is at least 0.94 cm.

22. A method according to claim 21, wherein the depth of the slit is not greater than 4 cm.

23. A method according to claim 21, wherein the depth of the slit is about 2 cm.

24. A method according to claim 21, wherein the depth of the slit is about 1.88 cm.

25. A method according to claim 20, wherein the thickness of the slit is in the range 0.002 to 0.11 cm and the pressure of the melt adjacent said interface is in the range 370,000 to 14,000 dynes/cm$^2$.

26. A method according to claim 25, wherein the thickness of the slit is in the range 0.02 to 0.04 cm and the pressure of the melt adjacent said interface is in the range 51,000 to 29,000 dynes/cm$^2$.

27. A method according to claim 1, wherein the crystal is gallium arsenide.

28. A method according to claim 27, wherein the depth of the slit is at least 0.83 cm.

29. A method according to claim 28, wherein the depth of the slit is not greater than 4 cm.

30. A method according to claim 28, wherein the depth of the slit is about 2 cm.

31. A method according to claim 28, wherein the depth of the slit is about 1.66 cm.

32. A method according to claim 27, wherein the thickness of the slit is in the range 0.002 to 0.11 cm and the pressure of the melt adjacent said interface is in the range 370,000 to 15,000 dynes/cm$^2$.

33. A method according to claim 32, wherein the thickness of the slit is in the range 0.02 to 0.04 cm and said pressure is in the range 51,000 to 30,000 dynes/cm$^2$.

34. A method according to claim 1, wherein the cross sectional area of the slit increases in the direction in which the growing crystal is pulled.

35. A method according to claim 1, wherein the run off angle of the melt from the crystal is substantially greater than zero degrees, and the cross section of the slot is substantially uniform throughout its length.

36. A method according to claim 1, wherein the run off angle of the melt from the crystal is substantially greater than zero degrees, and the major walls of the slit are divergent in the direction in which the crystal is pulled, the minor walls being parallel.

37. A method according to claim 36, wherein the angle between said major walls is in the range 10 minutes to 2 degrees.

38. A method according to claim 1, wherein the run off angle of the melt from the crystal is substantially greater than zero degrees, and both the major and minor walls of said slit diverge in the direction in which the crystal is pulled.

39. A method according to claim 38, wherein the angle between the major walls is in the range 10 minutes to 2 degrees and the angle between the minor walls is in the range 10 minutes to 2 degrees.

40. A method according to claim 1, wherein the run off angle of the melt from the crystal is zero degrees or close to zero degrees, and both the major and minor walls of the slit diverge in the direction in which the crystal is pulled.

41. A method according to claim 38, wherein the major walls diverge at an angle in the range 2 to 20 degrees and the minor walls diverge at the same angle.

42. A method according to claim 1, wherein said slit is provided in a shape forming member movable relative to a crucible containing said melt, and said pressure is created by effecting movement of said member towards said melt.

43. A method according to claim 42, wherein said movement of said member is effected by a fluid actuated piston and cylinder device.

44. A method according to claim 40, wherein said member is located above at least a portion of said melt, and said movement is effected by adding weight to said member.

45. A method according to claim 1, wherein said pressure created by supplying fluid under pressure to a surface of said melt.

46. A method according to claim 1, wherein said pressure is created by providing a head of said melt.

47. A method according to claim 1, wherein the crystal is pulled through said slit upwardly.

48. A method according to claim 1, wherein said crystal is pulled downwardly through said slit.

49. A method according to claim 1, preceded by the steps of heating crystallisable material to form said melt, applying a first pressure sufficient to cause said melt to enter said slit and contacting the melt in said slit with a seed, permitting transverse growth of the crystal in the slit and thereafter increasing the pressure to said level.

50. A method according to claim 49, wherein increase of said pressure to said level is caused at least partly by adjusting the temperature conditions under which freezing of the melt takes place to change the position of said interface within said slit.

51. A method according to claim 1, in which a fluid barrier is formed between the melt and the walls of said slit.

52. A method according to claim 51 wherein said fluid barrier is liquid.

53. A method according to claim 52, wherein said crystallisable material is silicon and said fluid barrier is calcium chloride, calcium fluoride, barium chloride, barium fluoride, lithium chloride, magnesium chloride, or magnesium fluoride, or binary and ternery salt mixtures thereof, or eutectic mixtures.

54. A method according to claim 53, wherein said liquid barrier is a said eutectic mixture, said mixture being $CaO\ Al_2O_3\ 2SiO_2:2CaO\ MgO\ 2SiO_2$.

55. A method according to claim 51 wherein said fluid barrier is gaseous.

56. A method according to claim 55 wherein the walls of said slit are porous and said fluid barrier is formed by forcing said gaseous fluid through said porous walls.

* * * * *